US009075085B2

(12) United States Patent
Koeppl

(10) Patent No.: US 9,075,085 B2
(45) Date of Patent: Jul. 7, 2015

(54) TEST SYSTEM FOR ANALYZING A CIRCUIT CARRIER

(75) Inventor: Josef Koeppl, Zachenberg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1435 days.

(21) Appl. No.: 12/161,642

(22) PCT Filed: Jan. 9, 2007

(86) PCT No.: PCT/EP2007/000127
§ 371 (c)(1),
(2), (4) Date: May 28, 2010

(87) PCT Pub. No.: WO2007/090490
PCT Pub. Date: Aug. 16, 2007

(65) Prior Publication Data
US 2010/0233964 A1 Sep. 16, 2010

(30) Foreign Application Priority Data

Feb. 9, 2006 (DE) .......................... 10 2006 006 082
May 9, 2006 (DE) .......................... 10 2006 021 569

(51) Int. Cl.
*G01R 31/20* (2006.01)
*G01R 27/02* (2006.01)
(Continued)

(52) U.S. Cl.
CPC .............. *G01R 1/06772* (2013.01); *G01R 1/24* (2013.01); *G01R 27/28* (2013.01); *G01R 31/2806* (2013.01)

(58) Field of Classification Search
CPC ........... G01R 1/06772; G01R 31/2806; G01R 1/06777; G01R 1/06738; G01R 1/06788; G01R 35/00; G01R 1/0408; G01R 27/2676; G01R 27/32; G01R 31/2889; G01R 31/2891; G01R 1/0416; G01R 1/045; G01R 1/067; G01R 1/06744; G01R 1/06761
See application file for complete search history.

(56) References Cited

U.S. PATENT DOCUMENTS 4,211,911 A * 7/1980 Dehn ............................ 219/746
5,192,908 A * 3/1993 Shibata .................... 324/750.19
(Continued)

FOREIGN PATENT DOCUMENTS

DE   19503329 A1   8/1996
DE   19641880 A1   4/1998
(Continued)

OTHER PUBLICATIONS

English translation of International Preliminary Report on Patentability, International Application No. PCT/EP2007/000127, mailed Nov. 6, 2008.

*Primary Examiner* — Vinh Nguyen
(74) *Attorney, Agent, or Firm* — Christensen O'Connor Johnson Kindness PLLC

(57) ABSTRACT

A test system for analyzing a circuit carrier which has been populated with a radio-frequency structure comprises a network analyzer having a signal generator for generating excitation signal which can be supplied to the radio-frequency structure via a signal line, an evaluation device for analyzing a measurement signal which returns from the radio-frequency structure, and a contact device which can be connected to the signal line and is intended to feed the excitation signal into the radio-frequency structure and to output the measurement signal. The contact device preferably has a measuring tip which is intended to hold test needles and can be used to make contact with a test point which is arranged on the circuit carrier and can be connected to the radio-frequency structure for signaling purposes.

13 Claims, 6 Drawing Sheets

(51) Int. Cl.
*G01R 1/067* (2006.01)
*G01R 31/28* (2006.01)
G01R 1/24 (2006.01)
G01R 27/28 (2006.01)

(56) References Cited

U.S. PATENT DOCUMENTS

| | | | |
|---|---|---|---|
| 5,483,169 A * | 1/1996 | Despain et al. | 324/534 |
| 5,506,515 A | 4/1996 | Godshalk | |
| 5,517,747 A * | 5/1996 | Pierro et al. | 29/600 |
| 5,561,378 A * | 10/1996 | Bockelman et al. | 324/754.07 |
| 6,281,690 B1 | 8/2001 | Frey | |
| 7,876,114 B2 * | 1/2011 | Campbell et al. | 324/754.06 |
| 2002/0011855 A1 * | 1/2002 | Heal et al. | 324/754 |
| 2002/0011856 A1 | 1/2002 | Huang | |
| 2004/0263181 A1 * | 12/2004 | Ye et al. | 324/534 |
| 2005/0128692 A1 * | 6/2005 | Schmitt et al. | 361/683 |
| 2005/0194981 A1 * | 9/2005 | Cole | 324/615 |
| 2006/0279299 A1 * | 12/2006 | Campbell et al. | 324/754 |
| 2012/0256707 A1 * | 10/2012 | Leiba et al. | 333/208 |

FOREIGN PATENT DOCUMENTS

| | | |
|---|---|---|
| DE | 10208693 A1 | 9/2003 |
| JP | 08015348 A2 | 1/1996 |

* cited by examiner

TEST SYSTEM FOR ANALYZING A CIRCUIT CARRIER

The invention relates to test system for analysing a circuit carrier populated with a radio-frequency structure.

In the case of circuit carriers for radio-frequency applications, which are designed to be populated with wired components and/or surface-mounted (SMD) components, it is conventional, primarily for reasons of cost, to carry out tests on the circuit carrier even before it is populated with components in order to investigate the circuit carrier with regard to material-specific and function-specific errors and to remove the circuit carrier from the production chain if it contains errors.

With a conventional test system, the connections on the circuit carrier are checked with regard to short circuits and open circuits by means of a continuity test. A test system known as the "Polar" test and manufactured by Polar Instruments, which can be used for testing circuit carriers, detecting short-circuit errors and for impedance analysis of the circuit carrier under test, is already known. In the context of impedance analysis, the test system by Polar Instruments operates by means of voltage-time reflectometry in the lower radio-frequency range up to a maximum frequency of approximately 300 MHz. Because of its comparatively low maximum frequency, this test system is clearly unsuitable for testing circuit carriers for radio-frequency applications, which can be operated within the frequency range up to 40 GHz. Furthermore, the measuring methods of voltage-time reflectometry used in the "Polar" test system are not suitable for determining the transmission and reflection parameters of a radio-frequency structure arranged on the circuit carrier, from which numerous material and function-specific parameters of the device under test could be derived.

The invention is based on the object of providing a test system, with which material-specific and function-specific radio-frequency properties and the functional competence of a circuit carrier populated with a radio-frequency structure can be analysed over a particularly broad frequency range.

This object is achieved according to the invention by the features of claim 1. Advantageous further developments provide the subject matter of the relevant dependent claims.

Accordingly, the test system for analysing a circuit carrier populated with a radio-frequency structure comprises a network analyser and a contact device. The network analyser provides a signal generator for generating an excitation signal, which can be supplied via a signal line to the radio-frequency structure on the circuit carrier. Furthermore, the network analyser comprises an evaluation device, to which a measurement signal returning from the radio-frequency structure can be supplied for analysis and comparison with the excitation signal. The excitation signal and the returning measurement signal can be fed via the signal line and the contact device, which can be connected to the latter, into the radio-frequency structure.

To feed in the excitation signal and to output the returning measurement signal, the contact device is preferably fitted with a probe, to which test needles are attached, thereby achieving a direct contact between the radio-frequency structure and the contact device. For this purpose, the test needles contact test points arranged on the circuit carrier and provided for feeding in the excitation signal and for the output of the measurement signal, which can be connected to the radio-frequency structure of the circuit carrier for the purpose of signalling.

In particular, the radio-frequency structure should be understood as a stripline structure formed on the circuit carrier, for example, a radio-frequency filter.

The particular advantages achieved by the invention are that, with the test system according to the invention comprising the network analyser, the circuit carrier populated with the radio-frequency structure can be analysed over a comparatively broad frequency range up to several gigahertz. Furthermore, in addition to determining the transmission and reflection parameters, a complete system analysis of the radio-frequency structure can be implemented using the network analyser, which can be connected via a contact device to the radio-frequency structure of the circuit carrier. The analysis of the radio-frequency structure on the circuit carrier also allows a determination of the circuit-carrier material and its dielectric properties and an investigation of the signal delay times occurring in the radio-frequency structure over the specified frequency range.

Moreover, using the test system according to the invention, the number of fully-fitted circuit carriers, that is to say, circuit carriers populated with wired and SMD components, which contain errors, can be very much-reduced. By removing error-containing circuit carriers before they are populated with wired and SMD components, the manufacturing costs for each fully-fitted and error-free circuit carrier can be reduced by a considerable factor, because the production process in the case of error-containing circuit carriers is terminated before the cost-intensive population with wired and SMD components.

To implement a particularly accurate analysis of the circuit carrier populated with the radio-frequency structure, it is expedient to provide one or more bridgeable blank strips between the radio-frequency structure and a surrounding structure arranged on the circuit carrier. The blank strip/s is/are optionally a component of the circuit-carrier material. Accordingly, the radio-frequency structure is electrically isolated from the surrounding circuit structure during the analysis. The analysis of the radio-frequency structure can therefore be implemented without interference. After the implementation of the analysis, the blank strip/s can be bridged by means of a bridge, in order to establish an electrically-conductive connection between the radio-frequency structure and the surrounding circuit structure of the circuit carrier and in order to use the circuit carrier in an application-specific manner.

According to one advantageous embodiment, the radio-frequency structure provided for analysing the circuit carrier is arranged on a panel edge connected to the circuit carrier, which can optionally be removed after the implementation of the analysis and/or completion of the circuit carrier. The radio-frequency structure arranged on the panel edge is also used especially in order to analyse the radio-frequency properties of the circuit-carrier material and, in the case of a multi-layered circuit carrier, to analyse the influence of the individual carrier layers on the radio-frequency structure.

In one expedient further development, in order to fix the circuit carrier and to bring the test point of the circuit carrier towards the test needles of the probe, the circuit carrier is mounted in a holding and positioning device. The contact device can also be fixed to the holding and positioning device in order to move the test needles arranged on the probe towards the test point to make contact.

According to one advantageous embodiment, the test needles arranged on the probe are designed in such a manner that at least one earth test needle is provided for contact with an earth lamella fitted to the test point, and a signal test needle is provided in order to contact a signal lamella fitted to the test point, through which the excitation signal can be fed into the radio-frequency structure.

A spacing distance of approximately 500-1500 micrometers is expediently provided between a contact surface of the signal lamella, which represents the connection point between the signal test needle and the signal lamella, and a contact surface of the earth lamella.

In order to isolate electrically from one another test needles arranged on one and the same probe, it is also expedient to provide each test needle with a protective sheath. In this context, the protective sheath is formed on the respective test needle in such a manner that the test needle is free from casing at the connection point to allow contact with the test point.

One advantageous embodiment provides calibration structures for the test system in order to eliminate parasitic-interference influences, which can occur at plug or adapter transitions and at connection points of the test needles.

In an expedient further development, the circuit carrier is manufactured from a material with dielectric properties, which is particularly suitable for use in the radio-frequency range. Such materials include in particular polytetrafluoroethylene, polyimides and glass and ceramic alloys.

A multi-layered design of the circuit carrier is expedient, because a comparatively large number of, for example, radio-frequency filters, can be realised as stripline structures on the circuit carrier. The multi-layered design also represents a space-saving variant, which allows a particularly simple realisation of a line structure for the connection of the electronic components on the circuit carrier provided.

According to one advantageous embodiment, the circuit carrier is designed for population with wired components in such a manner that perforations between opposing lateral surfaces of the circuit carrier are formed through the circuit carrier, in order to attach the wired components to the circuit carrier and for the electrical connection of the wired components to the connecting lines provided on the circuit carrier. Furthermore, the circuit carrier is designed for population with surface-mountable (SMD) components in such a manner that contact surfaces are arranged on the surfaces of the circuit carrier for fixing and also for the electrical contact between the SMD components and the connecting lines provided on the circuit carrier.

According to one advantageous embodiment, the signal generator provided on the network analyser for generating the excitation signal can be controlled to allow a sweep (frequency-sweep) of the excitation signal over a frequency range, which can be specified. The frequency sweep allows a comprehensive analysis of the circuit carrier over the specified frequency range with a particularly accurate frequency resolution.

According to one advantageous embodiment, the excitation signal can be decoupled in the network analyser and can be compared with the returning measurement signal as a reference signal for the analysis of the circuit carrier.

One exemplary embodiment is explained below with reference to the drawings. The drawings are as follows.

Figure 3:
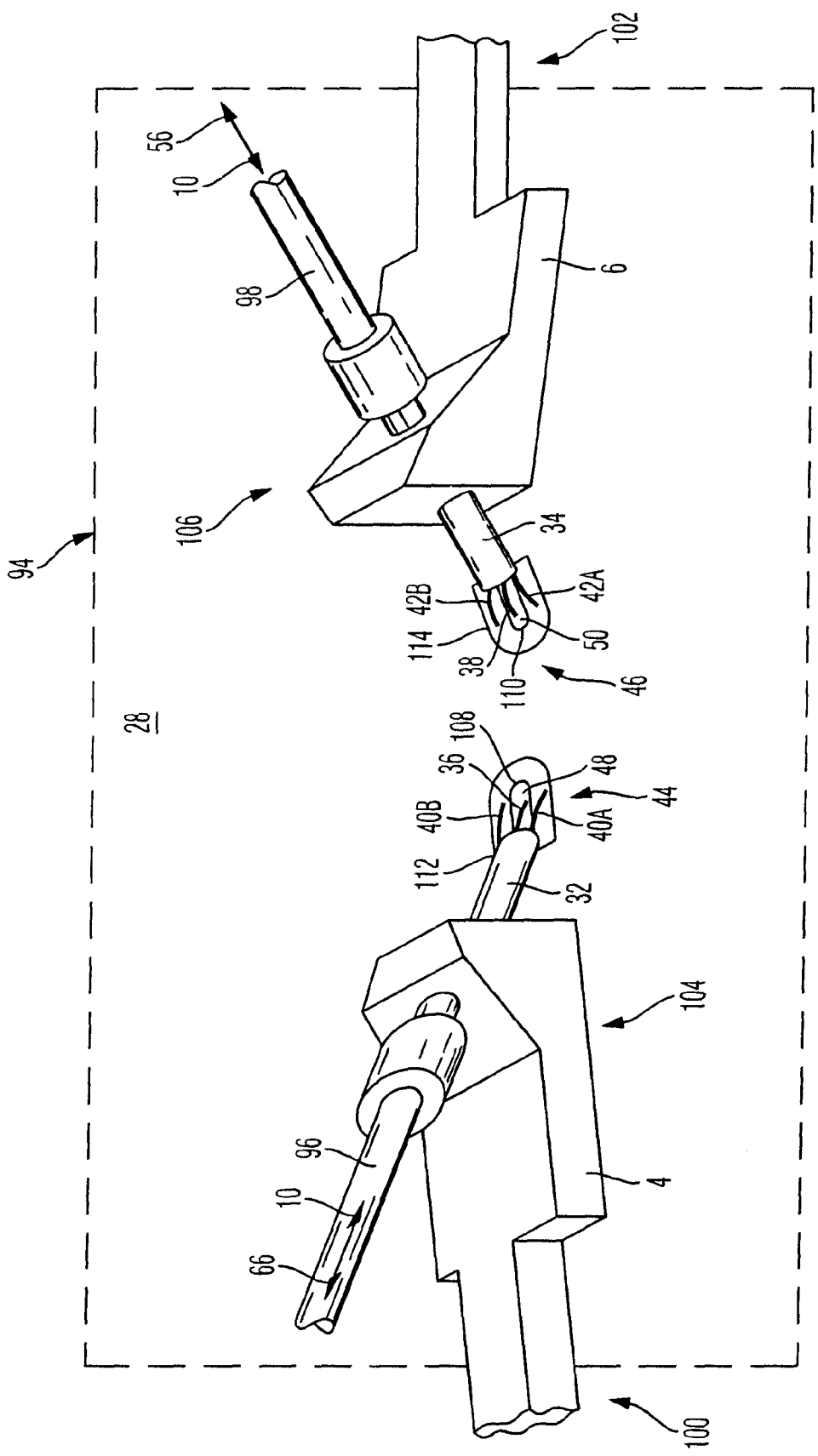
FIG. 3 shows contact devices according to FIG. 2 with probes and test needles, which contact test points arranged on the circuit carrier.
Figure 5C:
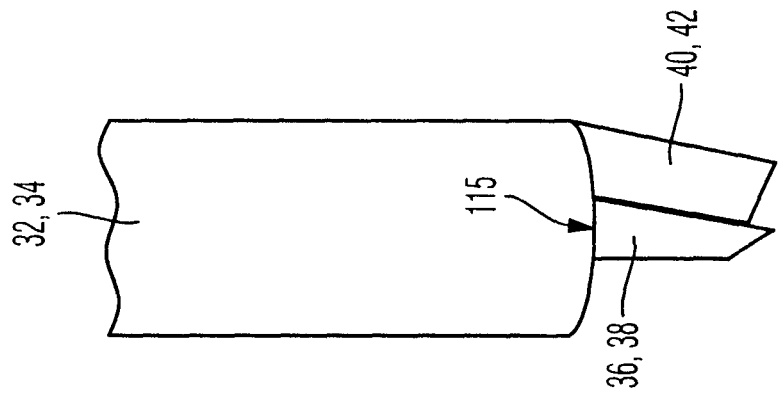
Figure 5B:
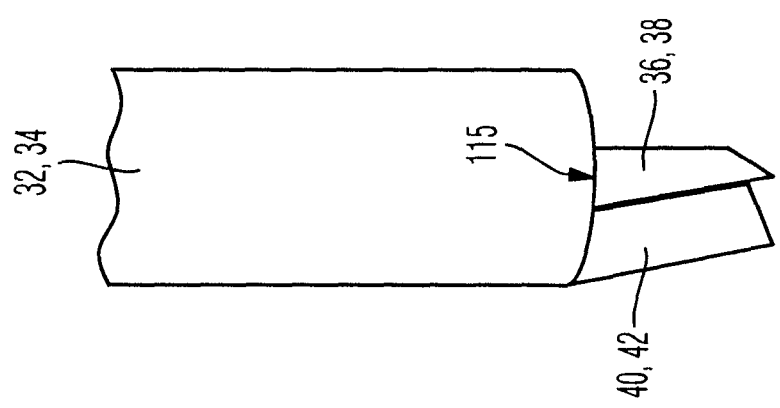
Figure 5A:
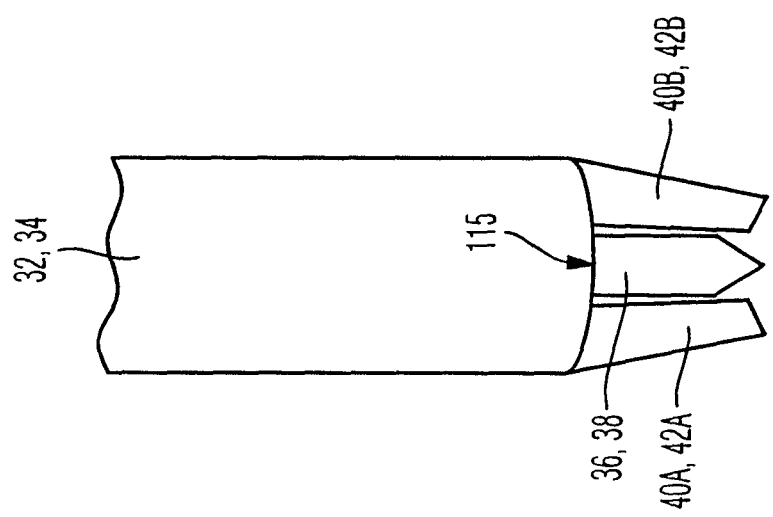
Figure 6:
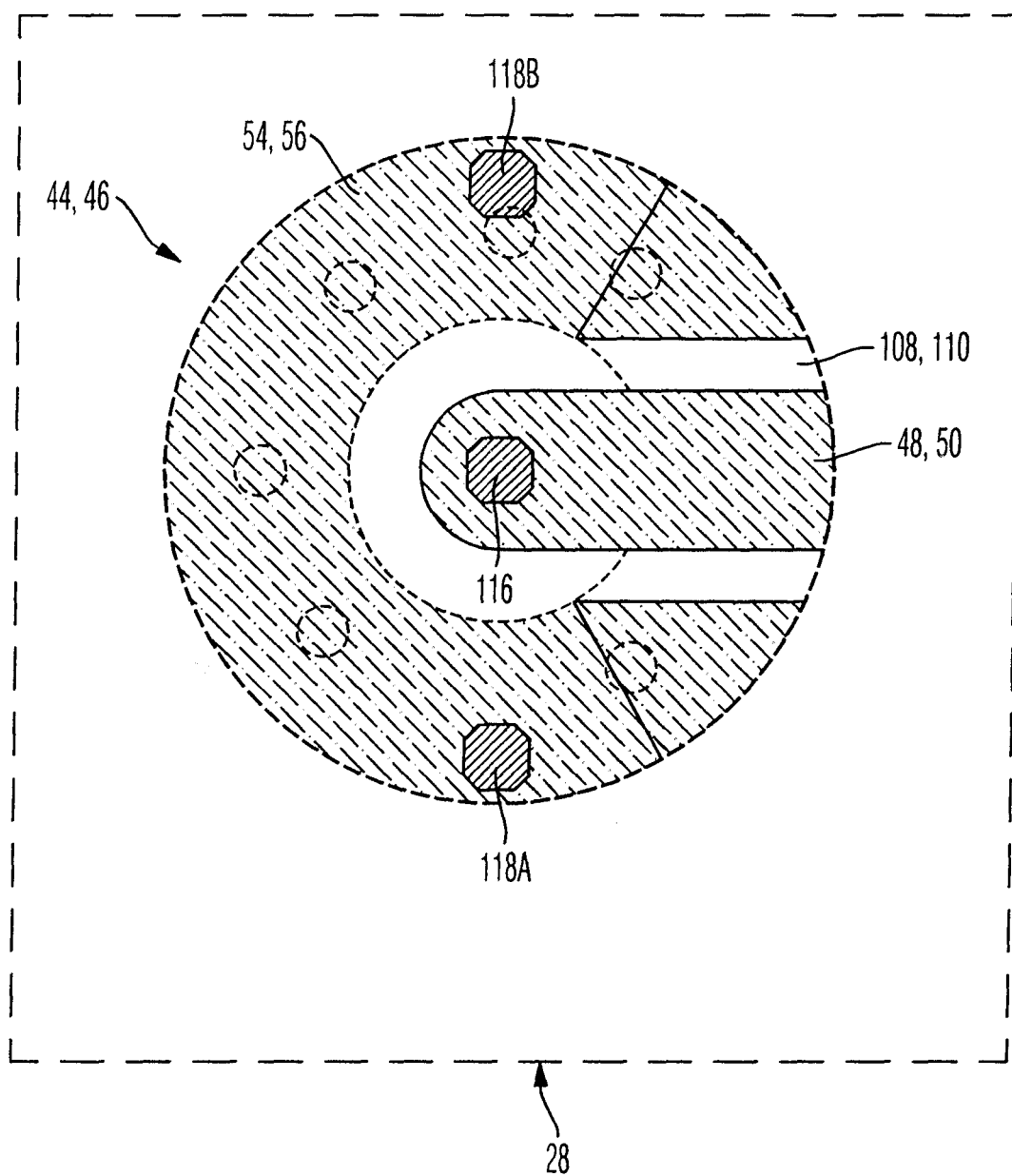

FIGS. 5A, 5B, 5C each show a probe with test needles according to FIG. 3; and FIG. 6 shows a test point according to FIG. 3.

Figure 1:
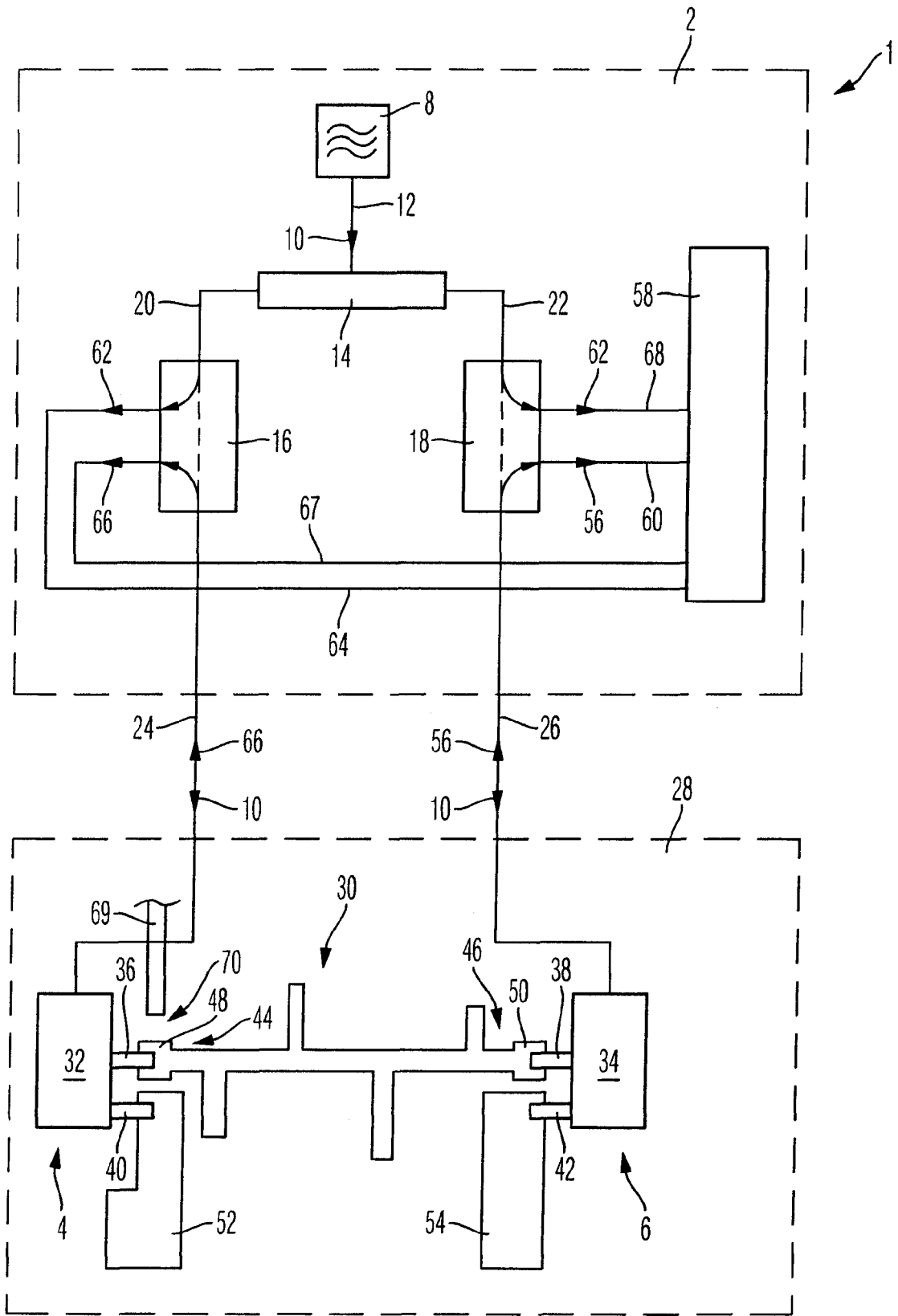
FIG. 1 shows a block-circuit diagram of a test system, to which a circuit carrier populated with radio-frequency structures is connected.

FIG. 1 shows a block-circuit diagram of the test system 1 with a network analyser 2 and with a first contact device 4 and a second contact device 6. The network analyser 2 comprises a signal generator 8 for generating the excitation signal 10, which can be supplied via a signal line 12 to a switching device 14. The network analyser 2 also comprises a first test bridge 16 and a second test bridge 18, which are connected to the switching device 14 via signal lines 20, 22 for the purpose of signalling.

The contact devices 4, 6 are connected via signal lines 24, 26 to the network analyser 2 for the purpose of signalling. The excitation signal 10 can be supplied to the contact devices 4, 6 via the signal lines 24, 26. In order to feed the excitation signal 10 into a radio-frequency structure 30 provided on the circuit carrier 28, which is designed in the exemplary embodiment illustrated in FIG. 1 as a frequency filter based on stripline technology, the contact devices 4, 6 each provide a probe 32, 34 with contact pins designed respectively as signal test needles 36, 38 and as earth test needles 40, 42. In order to feed in the excitation signals 10, the signal test needles 36, 38 contact signal lamellae 48, 50 provided on the test points 44, 46 arranged on the circuit carrier 28. The earth test needles 40, 42 contact earth lamellae 52, 54 provided on the test points 44, 46.

To analyse the circuit carrier 28 populated with the radio-frequency structure 30 using the test system 1, the switching device 14 is switched to supply the excitation signal 10 to the first contact device 4 via the signal line 20 and the signal line 24 or to the second contact device 6 via the signal line 22 and the signal line 26. The radio-frequency structure 30 can also be regarded as a device under test, wherein the excitation signal 10 for analysing the device under test is supplied either via the test point 44 acting as the input port or via the test point 46 acting as the output port.

The network analyser 2 is used, for example, to determine s-parameters. In order to determine the s-parameter "forward transmission factor $s_{21}$", which describes the ratio of a wave $b_2$, which is transmitted by the device under test and returns to the output port of the device under test, relative to a wave $a_1$ of the excitation signal arriving at the input port, the excitation signal 10 is supplied to the test point 44 of the radio-frequency structure 30. A measurement signal 56 transmitted by the radio-frequency structure 30 and returning on the signal line 26 is decoupled at the second test bridge 18 for evaluation on a signal line 60 leading to an evaluation device 58. The "forward transmission factor $s_{21}$" is therefore determined from the returning measurement signal 56 and the excitation signal 10, which is decoupled as a reference signal 62 on a signal line 64 leading to the evaluation device 58.

To determine the s-parameter "return transmission factor $s_{12}$", the excitation signal 10 is supplied to the radio-frequency structure 30 via the second contact device 6. A measurement signal 66 transmitted by the radio-frequency structure 30 to the input port, which is output at the first contact device 4 and returns on the signal line 24, is decoupled at the first test bridge 16 on a signal line 67 leading to the evaluation device 58. The measurement signal 66 supplied to the evaluation device 58 is then compared with the reference signal 62 decoupled at the second test bridge 18 and supplied via a signal line 68 to the evaluation device 58 in order to determine the "return transmission factor $s_{12}$".

From the determination of the s-parameters, properties of the radio-frequency structures on the circuit carrier, such as transmission- and reflection-attenuation, signal-delay times, signal-rising times, impedance characteristics, step responses and phase information, can be derived over a required frequency range. Moreover, parameters of the circuit carrier, such as its material, the dielectric properties of the material and, in the case of multi-layered circuit carriers, the quality of its layered structure, can be determined.

In order to implement the analysis of the radio-frequency structure 30 in a largely interference-free manner relative to the surrounding circuit structure 69, which is indicated in FIG. 1 merely by a truncated stripline, the radio-frequency structure 30 can be isolated electrically from the surrounding circuit structure 69 by means of one or more bridgeable blank strips 70.

Figure 2:
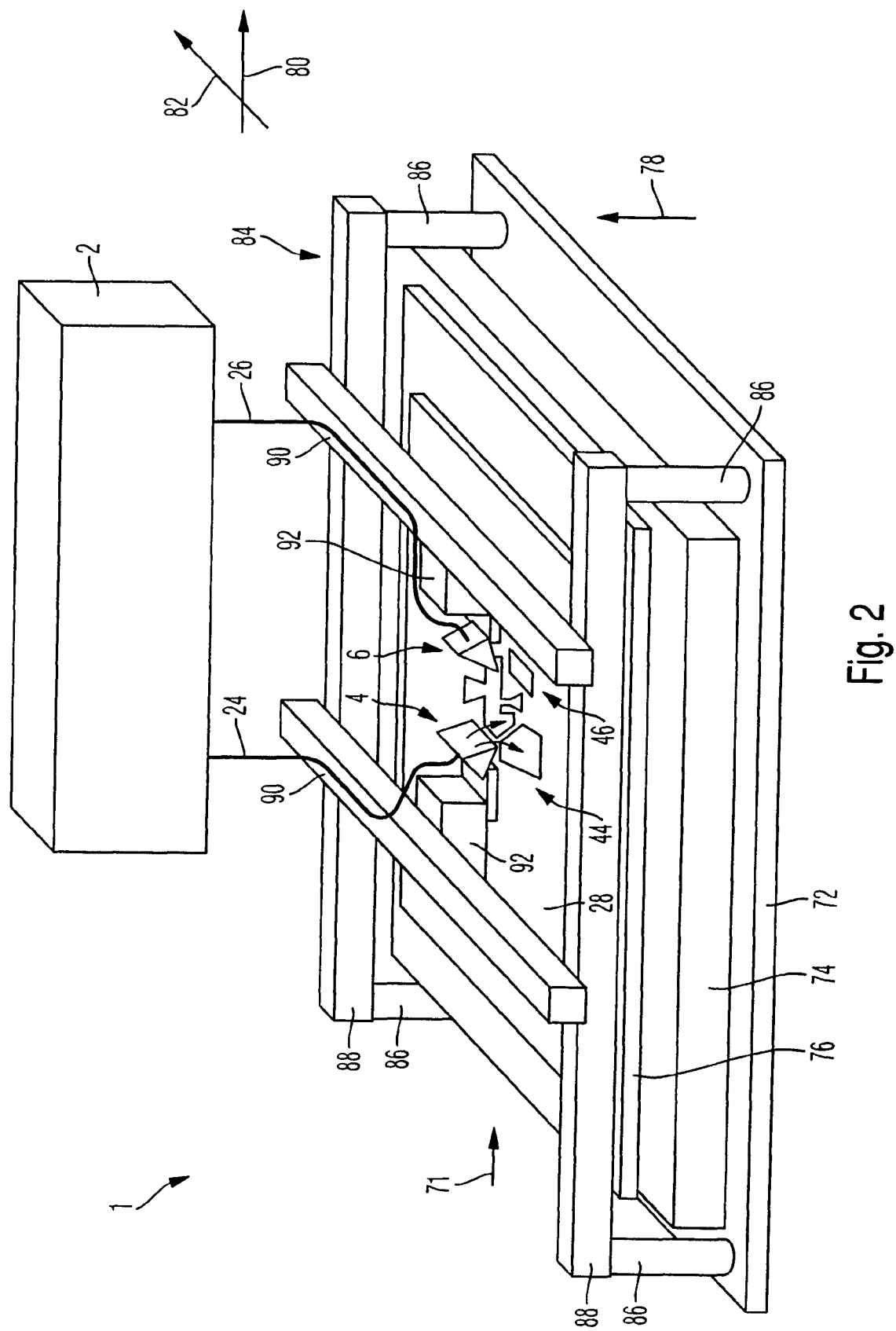
FIG. 2 shows a schematic structure of the test system according to FIG. 1.

FIG. 2 shows a schematic structure of the test system 1, wherein the circuit carrier 28 is mounted in a holding and positioning device 71. The holding and positioning device 71 is attached to a baseplate 72, on which a lower, fixed plate 74 and an upper, movable plate 76 are arranged. The circuit carrier 28 is positioned directly on the movable plate 76, which can be raised and lowered in a lifting direction 78 and rotated in displacement directions 80, 82.

Furthermore, a carrying device 84 with longitudinal beams 88 mounted on supports 86 provided for the contact devices 4, 6 is arranged on the baseplate 74. The longitudinal beams bear transverse beams 90, to which the contact devices 4, 6 are fixed via retaining blocks 92. In this context, the retaining blocks 92 are formed on the transverse beams 90 in a such a manner that they can be raised and lowered in the lifting direction 78 in order to lower end tips of the test needles, which are indicated by arrows in FIG. 2, down on onto the test points 44, 46 of the circuit carrier 28 mounted on the movable plate 76. The signal and earth lamellae are not illustrated in detail in FIG. 2 and are not provided with reference numbers. Furthermore, the contact devices 4, 6 are connected to the network analyser 2 via the signal lines 24, 26 designed, for example, as coaxial cables.

FIG. 3 shows a detail 94 of the circuit carrier 28 with the contact devices 4, 6 with connecting elements 96, 98 of the signal lines 24, 26 designed, for example, as coaxial cables, by means of which the excitation signal 10 can be fed via the test needles 36, 38, 40A, 40B, 42A, 42B to the test points 44, 46, and the returning measurement signal 56, 66 can be output. The contact devices 4, 6 are held onto the retaining blocks 92 illustrated in FIG. 2 by the rear parts 100, 102. The probes 32, 34 carrying the test needles 36, 38, 40A, 40B, 42A, 42B are arranged on the front parts 104, 106 of the contact devices 4, 6.

In the exemplary embodiment shown in FIG. 3, each probe 32, 34 carries one signal test needle 36, 38 and respectively two earth test needles 40A, 40B, 42A, 42B disposed at a distance from the signal test needle 36, 38 and electrically isolated from the latter. The test needles 36, 38, 40A, 40B, 42A, 42B contact the test points 44, 46 provided on the circuit carrier 28 with their end tips. In this context, in the exemplary embodiment shown in FIG. 3, the test points 44, 46 are designed in the form of horseshoes on the circuit carrier 28. The signal lamella 48, 50, which can be connected for the purpose of signalling to the radio-frequency structure 30 (FIG. 2), not illustrated in FIG. 3 for the sake of simplicity, is formed in the middle of the test point 44, 46. The signal lamella 48, 50 is electrically isolated from the earth lamella 52, 54 by a dielectric blank strip 108, 110. Furthermore, the earth lamella 52, 54 is arranged to be electrically isolated by blank strips 112, 114 relative to a circuit structure surrounding the test point 44, 46, which is not illustrated in FIG. 3.

Figure 4:
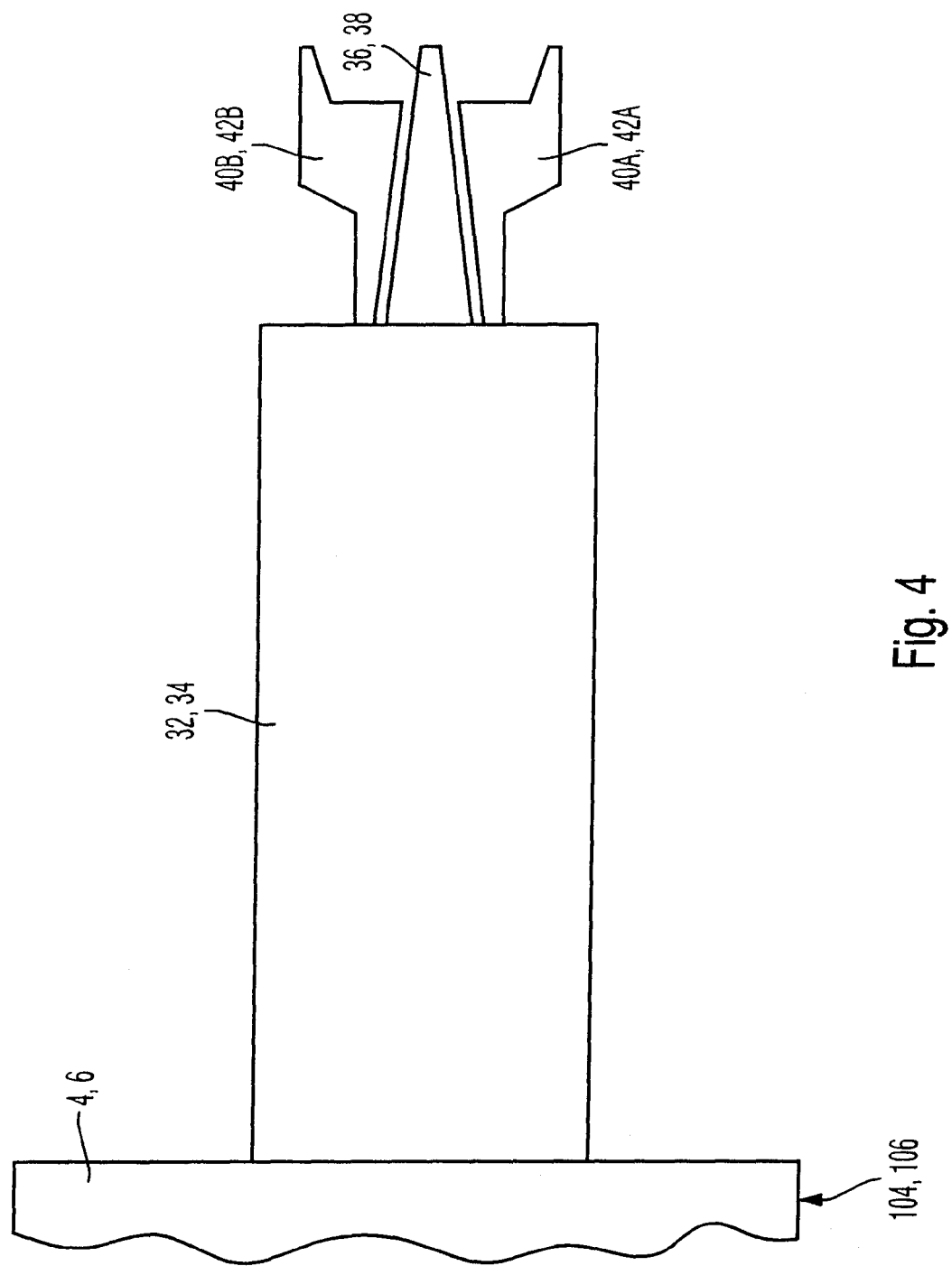
FIG. 4 shows a probe with test needles according to FIG. 3.

FIG. 4 shows in detail the probe 32, 34, which is disposed on the front part 104, 106 of the contact device 4, 6 and carries one signal test needle 36, 38 and two earth test needles 40A, 40B, 42A, 42B arranged at a distance from the signal test needle 36, 38 and electrically isolated from the latter. In this context, the signal needle 36, 38 shown in FIG. 4 is disposed between the two earth test needles 40A, 40B, 42A, 42B.

FIGS. 5A, 5B, 5C show the probe 32, 34 with test needles 36, 38, 40, 42, 40A, 40B, 42A, 42B arranged on the latter in different, variant arrangements and with different numbers of test needles. In FIG. 5A, the test needles 36, 38, 40A, 40B, 42A, 42B are arranged on the probe 32, 34 in the same manner as shown in FIG. 4. The test needles 36, 38, 40A, 40B, 42A, 42B are attached to the latter according to the scheme "earth-signal-earth" at a connecting end 115 of the probe 32, 34 provided for this purpose. In FIG. 5B, one signal test needle 36, 38 and one earth test needle 40, 42 are attached with left alignment according to the scheme "earth-signal" to the connecting end 115 of the probe 32, 34. By contrast, the arrangement of the test needles 36, 38, 40, 42 in FIG. 5C is reversed. Accordingly, the test needles are attached with right alignment to the connecting end 115 of the probe 32, 34.

FIG. 6 shows in greater detail the test point 44, 46 as illustrated in FIG. 3. The test point 44, 46 is arranged on a surface of the circuit carrier 28 and provides the earth lamella 54, 56, designed in this exemplary embodiment according to FIG. 6 in the shape of a horseshoe, and the signal lamella 48, 50, which can be connected for the purpose of signalling to the radio-frequency structure 30, not illustrated in FIG. 6. In this context, the signal lamella 48, 50 is arranged in an electrically-isolated manner relative to the earth lamella 54, 56 as a result of the horseshoe-shaped, dielectric blank strip 108, 110, which, in the exemplary embodiment according to FIG. 6, is a component of the circuit carrier 28 indicated with a dotted line.

The test point 44, 46 shown in FIG. 6 is designed to be especially suitable for the probe 32, 34 shown in FIG. 5A with one signal test needle 36, 38 and two earth test needles 40A, 40B, 42A, 42B. FIG. 6 also shows contact surfaces 116, 118A, 118B, presented as octagons, which are components of the test point 44, 46, with which the end tips of the test needles 36, 38, 40A, 40B, 42A, 42B come into contact. The contact surfaces 116, 118A, 118B are disposed at a spacing distance from one another in such a manner that the spacing distance between their mid-points is approximately 1000 μm in each case.

The invention is not restricted to the exemplary embodiment presented and, in particular, is also suitable for circuit carriers designed differently from those in the drawings and for test systems, especially in the case of a test system with a single contact device or with more than two contact devices for n-port devices under test.

The present invention is also particularly suitable for differential measurements with differential signals. In this context, a signal with 180° phase displacement (differential mode) is generated at two ports of the network analyser and fed into the radio-frequency structure. The measurement signal is also output in a differential manner, that is to say, at the output end, two test ports of the network analyser are again available, and, in particular, the observance of the phase difference of 180° through the radio-frequency structure under test is monitored. The differential measurement has the advantage that, it is insensitive to an environmentally-determined common-mode interference, which may be caused, for example, by the electrical power-supply network or also by other interference sources. Moreover, present-day radio-frequency structures are increasingly structured with differential wiring arrangements.

All of the features described above and illustrated in the drawings can be combined with one another as required.

The invention claimed is:

1. A test system for analyzing a circuit substrate, which has been assembled with a radio-frequency structure, the test system comprising:
   a signal generator configured to generate an excitation signal, which can be supplied via a signal line to the radio-frequency structure;
   an evaluation device configured to analyze a measurement signal, which returns from the radio-frequency structure;
   a contact device, which can be connected to the signal line, configured to feed the excitation signal into the radio-frequency structure and to output the measurement signal via test needles of a probe which is arranged on a contact device, the probe carrying one signal test needle and two ground test needles arranged at a distance from the signal test needle, the signal test needle disposed between the two ground test needles,
   wherein the test needles arranged on the probe are movable to make contact towards test points, which are arranged on the surface of the circuit substrate;
   wherein each test point comprises an earth lamella with a shape of a horseshoe and a signal lamella, which can be connected to the radio-frequency structure for signaling purposes, and
   wherein the test needles are attachable to the probe in a ground-signal-ground scheme.

2. The test system according to claim 1, wherein the radio-frequency structure is provided on a panel edge of the circuit substrate.

3. The test system according to claim 1, further comprising a holding and positioning device for holding and aligning the circuit carrier and the contact device.

4. The test system according to claim 1, wherein the a signal-test needle configured to contact a signal lamella provided on the test point and at least one ground test needle configured to contact an earth lamella provided on the test point, wherein the earth lamella is arranged to be a spaced distance and electrically isolated from the signal lamella.

5. The test system according to claim 4, wherein a spaced distance of approximately 500 μm to 1500 μm is provided between a contact surface disposed on the signal lamella and a contact surface disposed on the earth lamella.

6. The test system according to claim 1, wherein the test needle is surrounded at least partially by a protective sheath.

7. The test system according to claim 1, wherein the circuit substrate is formed from a dielectric material appropriate for radio-frequency applications.

8. The test system according to claim 7, wherein the dielectric material includes a material selected from a group consisting of polytetrafluoroethylene, polyimide, glass, and ceramic alloy.

9. The test system according to claim 1, wherein the circuit substrate is designed in a multi-layer manner.

10. The test system according to claim 1, wherein the circuit substrate is designed to be fitted with wired components.

11. The test system according to claim 1, wherein the circuit substrate is designed to be fitted with surface-mountable (SMD) components.

12. The test system according to claim 1, wherein the signal generator is designed to cover a specifiable frequency range of the excitation signal.

13. The test system according to claim 1, wherein the signal lamella is positioned in-between ends of the horseshoe-shaped earth lamella in an electrically isolated manner with respect to the earth lamella.

* * * * *

UNITED STATES PATENT AND TRADEMARK OFFICE
CERTIFICATE OF CORRECTION

| | | Page 1 of 1 |
|---|---|---|
| PATENT NO. | : 9,075,085 B2 | |
| APPLICATION NO. | : 12/161642 | |
| DATED | : July 7, 2015 | |
| INVENTOR(S) | : J. Koeppl | |

It is certified that error appears in the above-identified patent and that said Letters Patent is hereby corrected as shown below:

Claims

| COLUMN | LINE | ERROR |
|---|---|---|
| 7 | 34-35 | "wherein the a signal-test needle" should read |
| (Claim 4, | lines 1-2) | --wherein the probe includes a signal-test needle-- |

Signed and Sealed this
Twenty-third Day of February, 2016

Michelle K. Lee
*Director of the United States Patent and Trademark Office*